US007633133B2

(12) United States Patent
Noma et al.

(10) Patent No.: US 7,633,133 B2
(45) Date of Patent: Dec. 15, 2009

(54) SEMICONDUCTOR DEVICE AND MANUFACTURING METHOD OF THE SAME

(75) Inventors: Takashi Noma, Gunma (JP); Kazuo Okada, Gunma (JP); Shinzo Ishibe, Gunma (JP); Katsuhiko Kitagawa, Gunma (JP); Yuichi Morita, Gunma (JP); Shigeki Otsuka, Chiba (JP); Hiroshi Yamada, Gunma (JP); Noboru Okubo, Saitama (JP); Hiroyuki Shinogi, Gunma (JP); Mitsuru Okigawa, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 283 days.

(21) Appl. No.: 11/639,411

(22) Filed: Dec. 15, 2006

(65) Prior Publication Data

US 2007/0145590 A1    Jun. 28, 2007

(30) Foreign Application Priority Data

Dec. 15, 2005   (JP)   ............................. 2005-361707

(51) Int. Cl.
   *H01L 31/0203*   (2006.01)
   *H01L 31/0216*   (2006.01)
   *H01L 31/0224*   (2006.01)

(52) U.S. Cl. .................. 257/434; 257/433; 257/435; 257/459; 257/E31.122; 257/E31.124

(58) Field of Classification Search ......... 257/431–435, 257/436, 448, 459, 692, 773, 778, 466, E31.122, 257/E31.124, E23.114
See application file for complete search history.

(56) References Cited

U.S. PATENT DOCUMENTS 5,656,816 A    8/1997    Tanaka (Continued)

FOREIGN PATENT DOCUMENTS

JP    5-21698    1/1993

(Continued)

OTHER PUBLICATIONS

Horikoshi, K. et al., U.S. Office Action, mailed Feb. 19, 2009, directed to a related U.S. Appl. No. 12/103,857; 8 pages.

(Continued)

*Primary Examiner*—Jerome Jackson, Jr.
*Assistant Examiner*—Yu Chen
(74) *Attorney, Agent, or Firm*—Morrison & Foerster LLP (57) ABSTRACT

This invention provides a semiconductor device that solves a problem that a pattern of a wiring formed on a back surface of a semiconductor substrate is reflected on an output image. A light receiving element (e.g. a CCD, an infrared ray sensor, a CMOS sensor, or an illumination sensor) is formed on a front surface of a semiconductor substrate, and a plurality of ball-shaped conductive terminals is disposed on a back surface of the semiconductor substrate. Each of the conductive terminals is electrically connected to a pad electrode on the front surface of the semiconductor substrate through a wiring layer. The wiring layer and the conductive terminal are formed on the back surface of the semiconductor substrate except in a region overlapping the light receiving element in a vertical direction, and are not disposed in a region overlapping the light receiving element.

10 Claims, 6 Drawing Sheets

U.S. PATENT DOCUMENTS

| | | |
|---|---|---|
| 5,804,827 A | 9/1998 | Akagawa et al. |
| 5,929,440 A | 7/1999 | Fisher |
| 5,973,337 A | 10/1999 | Knapp et al. |
| 6,228,676 B1 | 5/2001 | Glenn et al. |
| 6,229,223 B1 | 5/2001 | Watanabe |
| 6,326,689 B1 | 12/2001 | Thomas |
| 6,372,351 B1 | 4/2002 | Takemiya et al. |
| 6,455,774 B1 | 9/2002 | Webster |
| 6,465,786 B1 | 10/2002 | Rhodes |
| 6,646,289 B1 | 11/2003 | Badehi |
| 6,693,337 B2 * | 2/2004 | Yoneda et al. ............... 257/436 |
| 6,717,147 B2 * | 4/2004 | Oda ........................ 250/338.1 |
| 7,102,238 B2 | 9/2006 | Noma et al. |
| 7,183,589 B2 | 2/2007 | Kameyama et al. |
| 7,332,783 B2 | 2/2008 | Misawa |
| 7,332,789 B2 | 2/2008 | Violette |
| 2002/0019069 A1 | 2/2002 | Wada |
| 2003/0160185 A1 | 8/2003 | Homme |
| 2004/0016983 A1 | 1/2004 | Misawa |
| 2004/0076797 A1 | 4/2004 | Zilber et al. |
| 2004/0108588 A1 | 6/2004 | Gilleo |
| 2004/0130640 A1* | 7/2004 | Fujimori .................... 348/294 |
| 2004/0183152 A1 | 9/2004 | Yoneda et al. |
| 2004/0188699 A1 | 9/2004 | Kameyama et al. |
| 2005/0009238 A1 | 1/2005 | Okigawa |
| 2005/0048740 A1 | 3/2005 | Noma et al. |
| 2005/0077458 A1 | 4/2005 | Ma et al. |
| 2007/0145420 A1 | 6/2007 | Okada et al. |
| 2008/0258258 A1 | 10/2008 | Horikoshi et al. |
| 2009/0026610 A1 | 1/2009 | Kitagawa et al. |

FOREIGN PATENT DOCUMENTS

| | | |
|---|---|---|
| JP | 9-321333 | 12/1997 |
| JP | 2000-349238 | 12/2000 |
| JP | 2001-085652 A | 3/2001 |
| JP | 2004-55674 | 2/2004 |
| JP | 2006-93367 | 4/2006 |
| KR | 10-2002-0048716 | 6/2002 |
| KR | 10-2004-0077472 | 9/2004 |
| KR | 10-2004-0092435 | 11/2004 |
| KR | 10-2005-0016041 | 2/2005 |
| WO | WO-99/40624 | 8/1999 |
| WO | WO-2005/004195 | 1/2005 |

OTHER PUBLICATIONS

Okada, K. et al., U.S. Office Action, mailed Jan. 3, 2008, directed to a related U.S. Appl. No. 11/639,410; 11 pages.

Okada, K. et al., U.S. Office Action, mailed Jun. 25, 2008, directed to a related U.S. Appl. No. 11/639,410; 13 pages.

Okada, K. et al., U.S. Office Action, mailed Dec. 30, 2008, directed to a related U.S. Appl. No. 11/639,410; 15 pages.

European Search Report, mailed Jun. 10, 2009, directed to European Patent Application No. 06026027.0; 6 pages.

European Search Report, mailed Jun. 10, 2009, directed to European Patent Application No. 06026088.2; 5 pages.

Okada, K. et al., U.S. Office Action, mailed Jul. 22, 2009, directed to related U.S. Appl. No. 11/639,410; 16 pages.

Horikoshi, K. et al., U.S. Office Action mailed on Sep. 21, 2009, directed to a related U.S. Appl. No. 12/103,857; 13 pages.

* cited by examiner

SEMICONDUCTOR DEVICE AND MANUFACTURING METHOD OF THE SAME

CROSS-REFERENCE OF THE INVENTION

This application claims priority from Japanese Patent Application No. 2005-361707, the content of which is incorporated herein by reference in its entirety.

BACKGROUND OF THE INVENTION

1. Field of the Invention

The invention relates to a semiconductor device, particularly, a chip size package type semiconductor device having a light receiving element.

2. Description of the Related Art

A CSP (chip size package) has received attention in recent years as a new packaging technology. The CSP is a small package having about the same outside dimensions as those of a semiconductor die packaged in it.

A BGA (ball grid array) type semiconductor device has been known as a type of the CSP. In the BGA type semiconductor device, a plurality of ball-shaped conductive terminals made of metal such as solder is arrayed on one surface of a package and is electrically connected to a semiconductor die mounted on the other surface of the package.

When the BGA type semiconductor device is mounted on electronic equipment, the semiconductor die is electrically connected to an external circuit on a printed board by bonding the conductive terminals to wiring patterns on the printed board.

Such a BGA type semiconductor device has advantages in providing a large number of conductive terminals and in reducing a size over the other CSP type semiconductor devices such as an SOP (small outline package) and a QFP (quad flat package), which have lead pins protruding from their sides. Therefore, the BGA type semiconductor device has a wide field of application.

Figure 6A:
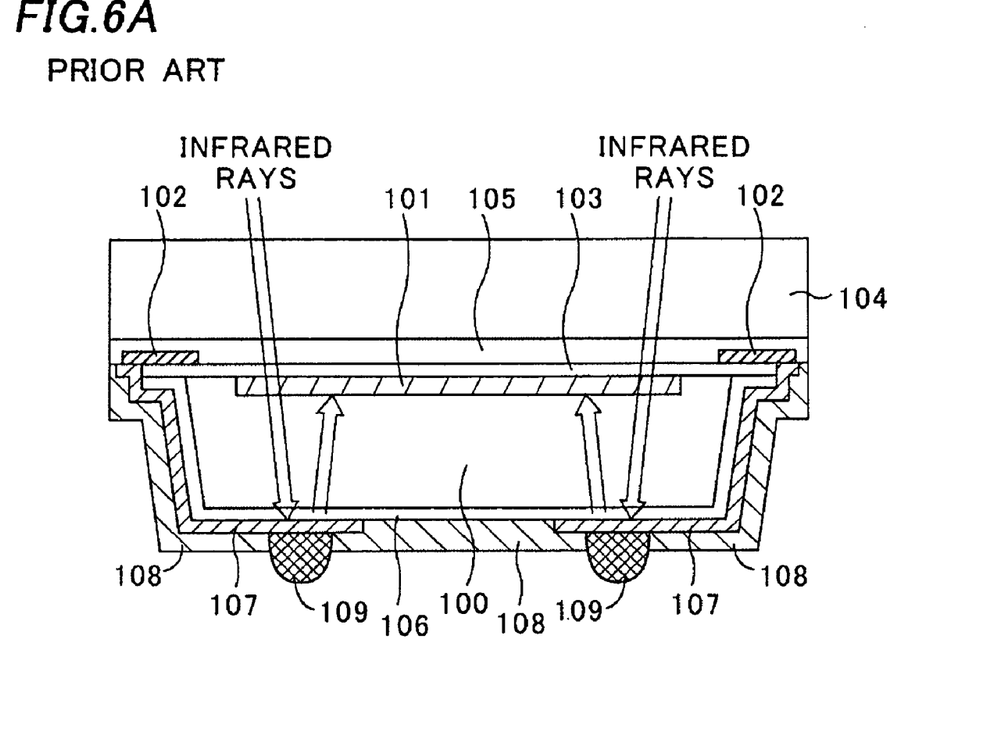
FIGS. 6A and 6B are a cross-sectional view and an output image view for explaining a conventional semiconductor device.

FIG. 6A is a schematic cross-sectional view of a conventional BGA type semiconductor device having a light receiving element. A light receiving element 101 such as a CCD (charge coupled device) image sensor or a CMOS image sensor is provided on a front surface of a semiconductor substrate 100 made of silicon (Si) or the like, and a pad electrode 102 is further formed with a first insulation film 103 interposed therebetween. A light transparent substrate 104 made of, for example, glass, quartz or the like is further attached on the front surface of the semiconductor substrate 100 with a resin layer 105 made of epoxy resin or the like interposed therebetween. Furthermore, a second insulation film 106 made of a silicon oxide film or a silicon nitride film is formed on a side surface and a back surface of the semiconductor substrate 100.

Furthermore, a wiring layer 107 electrically connected to the pad electrode 102 is formed on the second insulation film 106 from the front surface to the back surface along the side surface of the semiconductor substrate 100. A protection layer 108 made of a solder resist or the like is formed covering the second insulation film 106 and the wiring layer 107. An opening is formed in a predetermined region of the protection layer 108 on the wiring layer 107, and a ball-shaped conductive terminal 109 is formed being electrically connected to the wiring layer 107 through this opening. The relevant technology is disclosed in Japanese Patent Application Publication No. 2002-512436.

Figure 6B:
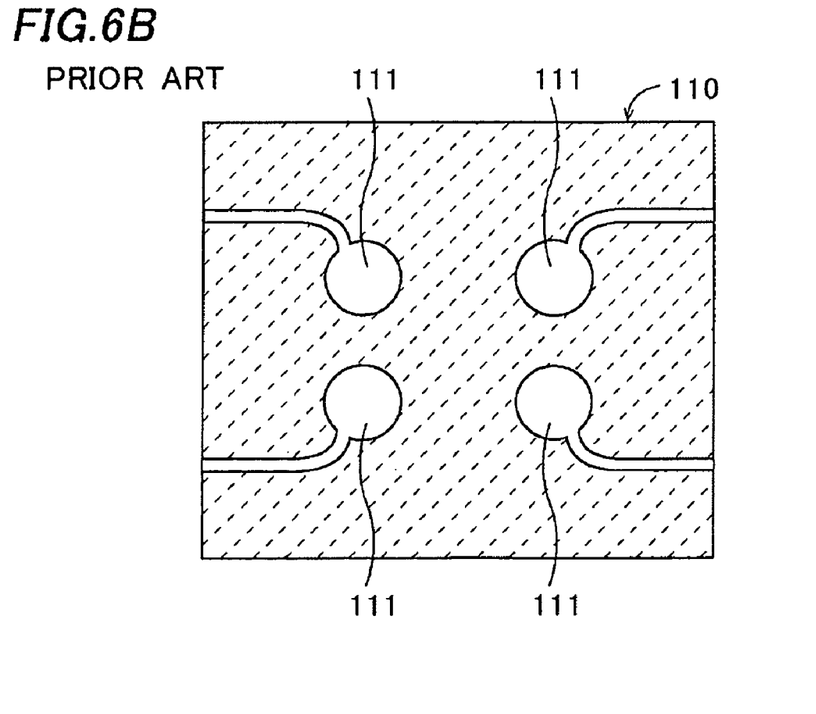

In this conventional BGA type semiconductor device, however, when an infrared ray is used, there can be a case where an infrared ray passing through the light transparent substrate 104 also passes through the semiconductor substrate 100 and reaches the wiring layer 107 formed on the back surface of the semiconductor substrate 100, as shown by an arrow in FIG. 6A. Then, this infrared ray is reflected by the wiring layer 107 to travel upward (toward the light receiving element 101) and the light receiving element 101 receives the reflected light, thereby causing a problem that patterns 111 of the conductive terminal 109 and the wiring layer 107 are reflected on an output image 110 as shown in FIG. 6B.

SUMMARY OF THE INVENTION

The invention is made with consideration of the above problem, and its feature is as follows. That is, a semiconductor device of the invention includes: a semiconductor substrate having a light receiving element on its front surface; a light transparent substrate disposed above the light receiving element and attached on the semiconductor substrate; a wiring layer formed on a back surface of the semiconductor substrate; and a protection layer covering the wiring layer, wherein the wiring layer is formed on the back surface of the semiconductor substrate except in a region overlapping the light receiving.

Furthermore, in the semiconductor device of the invention, an infrared ray absorbent material is mixed in the protection layer.

A method of manufacturing a semiconductor device of the invention mainly has a following feature. That is, the method includes: preparing a semiconductor substrate formed with a light receiving element and a pad electrode on its front surface; attaching a light transparent substrate on the front surface of the semiconductor substrate; forming a wiring layer on a back surface of the semiconductor substrate except in a region overlapping the light receiving element, the wiring layer being electrically connected to the pad electrode; and forming a protection layer covering the wiring layer.

In the method of the invention, an infrared ray absorbent material is mixed in the protection layer when the protection layer is formed.

DETAILED DESCRIPTION OF THE INVENTION

Figure 1A:
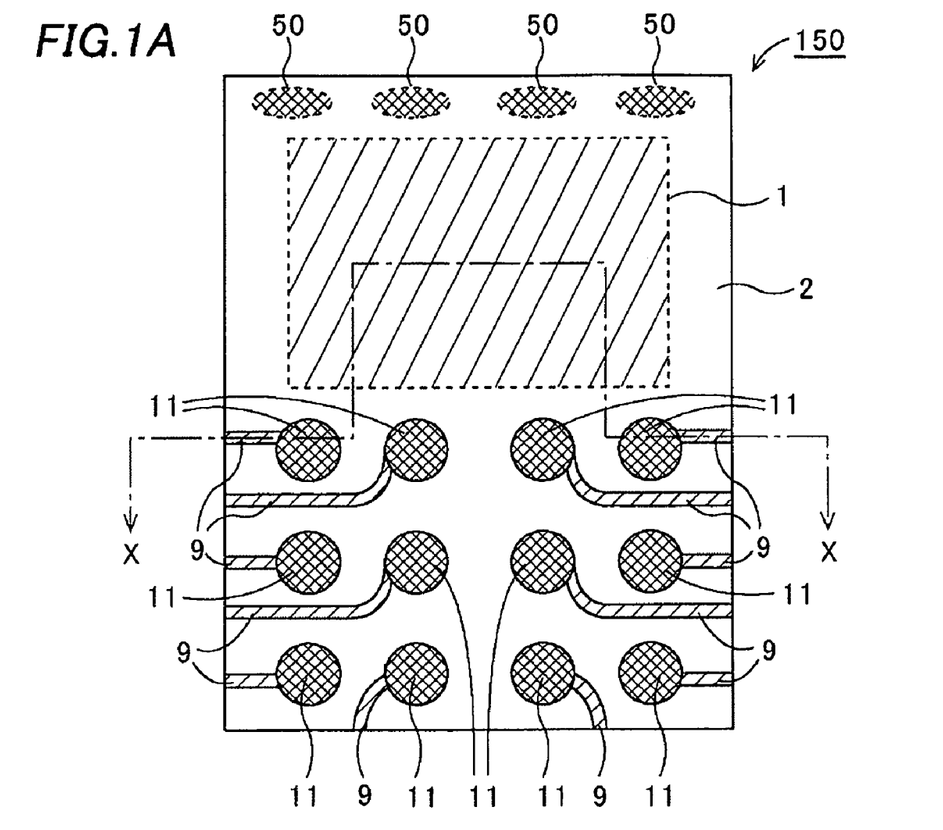
FIGS. 1A and 1B are a plan view and a cross-sectional view for explaining a semiconductor device and its manufacturing method of a first embodiment of the invention.
Figure 1B:
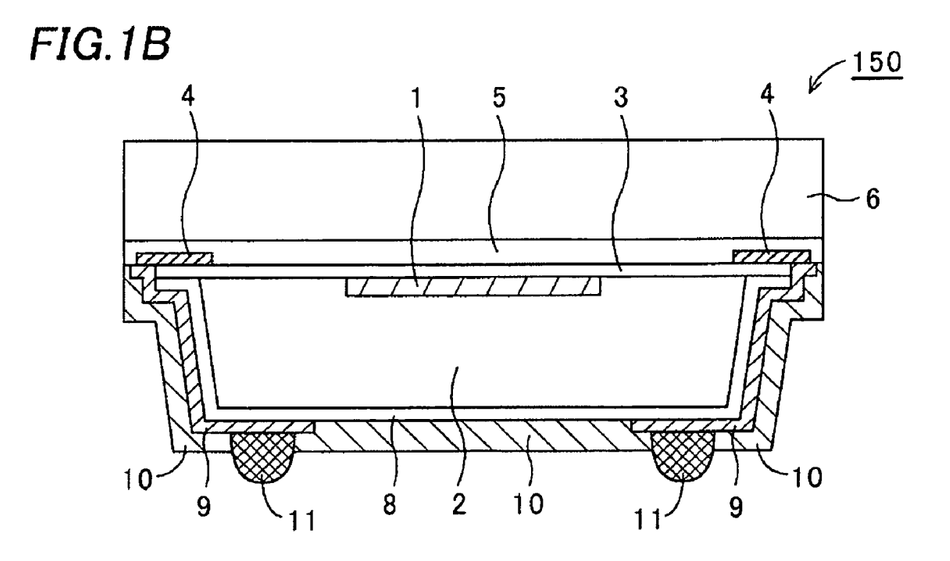

A first embodiment of the invention will be described referring to figures. FIG. 1A is a schematic plan view of a back surface of a semiconductor device 150 of the first embodiment of the invention, and FIG. 1B is a cross-sectional view of FIG. 1A along line X-X. It is noted that some components such as a protection layer 10, a pad electrode 4 and so on are omitted in FIG. 1A for convenience.

A light receiving element 1 (e.g. an element such as a CCD sensor, a CMOS sensor, or an illumination sensor) that detects an infrared ray having a wavelength of about 700 nm to 2500 nm is formed on a front surface of a semiconductor substrate 2 of this semiconductor device 150. A plurality of ball-shaped conductive terminals 11 is disposed on a back surface of the semiconductor substrate 2, and each of the conductive terminals 11 is electrically connected to the pad electrode 4 formed on the front surface of the semiconductor substrate 2 through a wiring layer 9.

In this embodiment, the wiring layer 9 and the conductive terminal 11 are formed on the back surface of the semiconductor substrate 2 except in a region overlapping the light receiving element 1 in a vertical direction (in a vertical direction relative to the sheet surface in FIG. 1A) and not disposed in a region overlapping the light receiving element 1.

This structure may cause a case where an infrared ray entering from the light transparent substrate 6 toward the back surface of the semiconductor substrate 2 through the semiconductor substrate 2 or an infrared ray entering from the back surface of the semiconductor substrate 2 is diffusely reflected by the protection layer 10 made of a solder resist or the like or a bottom of the semiconductor device 150 (a surface contacting to the other components), and the light receiving element 1 receives the reflected light, thereby causing bad influence such as blurring an output image.

Therefore, for enhancing reliability more, it is preferable to add an infrared ray absorbent such as, for example, a black pigment to the protection layer 10 covering the back surface of the semiconductor substrate 2. With this structure, an infrared ray reaching the protection layer 10 is all absorbed, or even if not all absorbed only a slight amount of infrared ray is reflected, thereby minimizing the influence of diffuse reflection. Furthermore, for preventing the influence of diffuse reflection, too, an infrared ray absorption layer having the same infrared ray absorption effect as above may be provided in a region overlapping the light receiving element 1, in addition to the protection layer 10. It is preferable that the infrared ray absorbent added to the protection layer 10 or the infrared ray absorbent layer absorbs an infrared ray having a wavelength of about 700 nm to 2500 nm in its characteristics.

Furthermore, with the structure where the wiring layer 9 and the conductive terminal 11 are not disposed in the region overlapping the light receiving element 1, the plurality of conductive terminals 11 may gather in a predetermined region on the back surface, depending on the size or position of the light receiving element 1, resulting in improper packaging of the semiconductor device 150 on a module such as a printed board due to its unbalance. Therefore, by providing a dummy electrode 50 on the back surface of the semiconductor substrate 2 according to needs, packaging strength is equalized, contributing to the improvement.

Next, a method of manufacturing the semiconductor device 150 of the first embodiment of the invention will be described. FIGS. 2A to 3C are cross-sectional views of FIG. 1A along line X-X in manufacturing order.

Figure 2A:
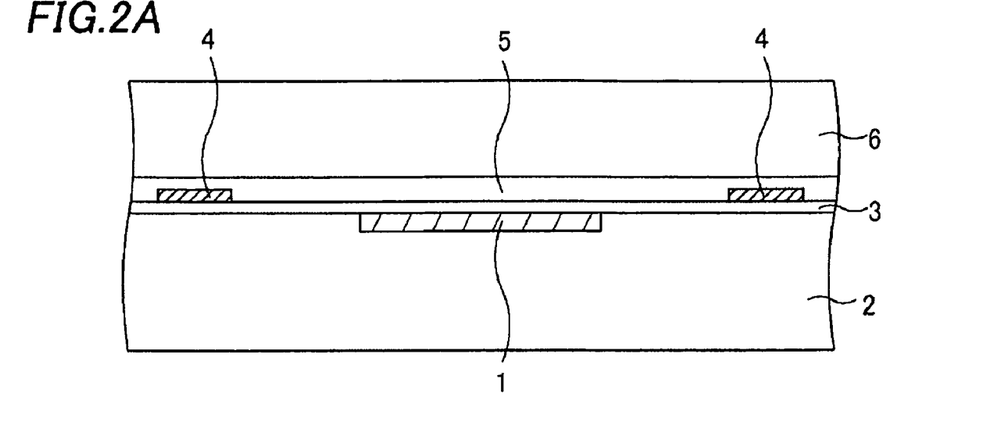
FIGS. 2A, 2B, and 2C are cross-sectional views for explaining the semiconductor device and its manufacturing method of the first embodiment of the invention.

First, as shown in FIG. 2A, the semiconductor substrate 2 made of silicon (Si) or the like and formed with the light receiving element 1 on its front surface is prepared. Then, a first insulation film 3 (e.g. a silicon oxide film formed by a thermal oxidation method, a CVD method or the like) is formed on the front surface of the semiconductor substrate 2 to have a thickness of, for example, 2 μm.

Then, a metal layer of aluminum (Al), copper (Cu), or the like is formed by a sputtering method, a plating method, or the other deposition method, and the metal layer is etched using a photoresist layer (not shown) as a mask to form the pad electrode 4 having a thickness of, for example, 1 μm on the first insulation film 3. The pad electrode 4 is an external connection electrode electrically connected to the light receiving element 1 or the surrounding elements. Then, a passivation film (e.g. a silicon nitride film formed by a CVD method) (not shown) is formed on the front surface of the semiconductor substrate 2, covering a portion of the pad electrode 4.

Then, the light transparent substrate 6 is attached on the front surface of the semiconductor substrate 2 including on the pad electrode 4 with a resin layer 5 made of epoxy resin or the like interposed therebetween. The light transparent substrate 6 is made of a transparent or semitransparent material such as glass or quartz and has light transmission characteristics.

Then, back-grinding is performed to the back surface of the semiconductor substrate 2 to thin the semiconductor substrate 2 to a thickness of, for example, about 100 μm. There can be a case where the grinding process is not needed depending on applications or specifications of an end-product and the initial thickness of the prepared semiconductor substrate 2.

Figure 2B:
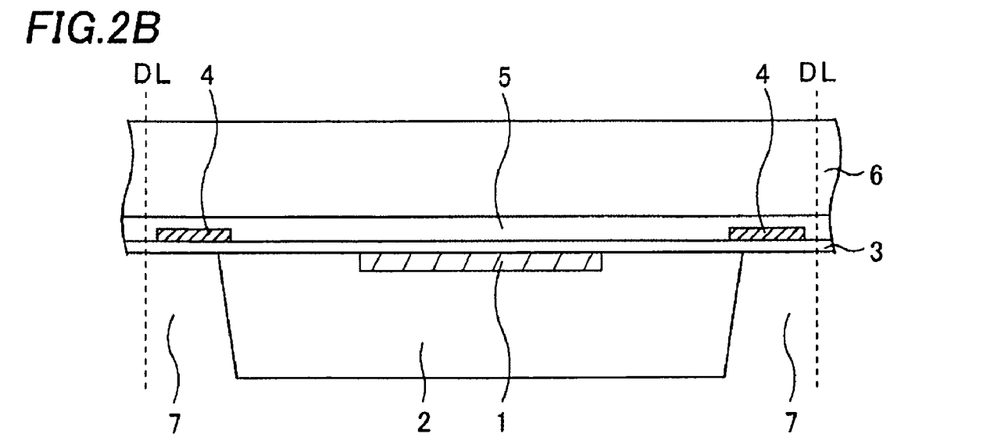

Then, as shown in FIG. 2B, a portion of the semiconductor substrate 2 in a position corresponding to the pad electrode 4 is selectively etched from the back surface of the semiconductor substrate 2 to expose the first insulation film 3 including a portion of the first insulation film 3 on the pad electrode 4. Hereafter, this exposed portion is called an opening 7. In this embodiment, this opening 7 has a tapered shape of which the diameter is reducing from the back surface toward the front surface of the semiconductor substrate 2. It is also possible to form the opening 7 in a straight shape by etching so that the side surface of the semiconductor substrate 2 is vertical to a main surface of the light transparent substrate 6 although not shown in the figure.

Figure 2C:
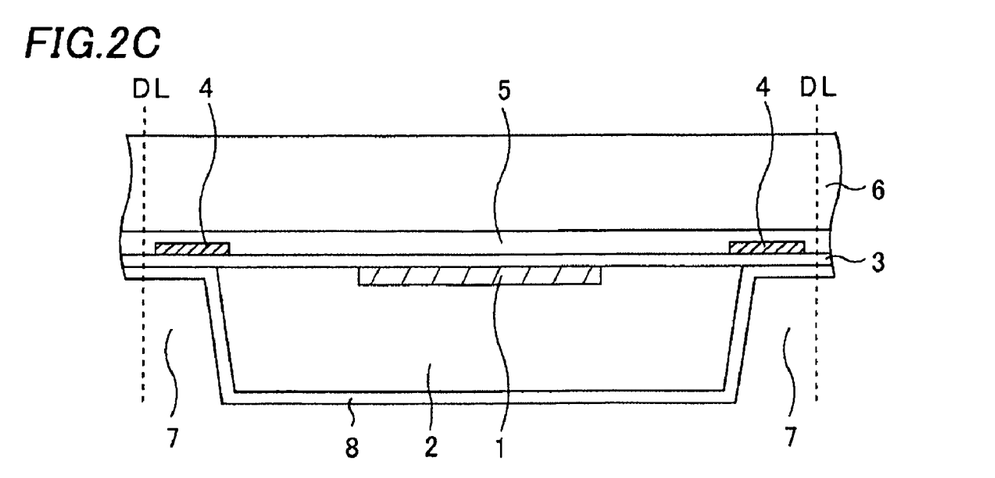

Next, as shown in FIG. 2C, a second insulation film 8 is formed on the side surface and back surface of the semiconductor substrate 2 including in the opening 7. This second insulation film is a silicon oxide film or a silicon nitride film formed by, for example, a plasma CVD method.

Figure 3A:
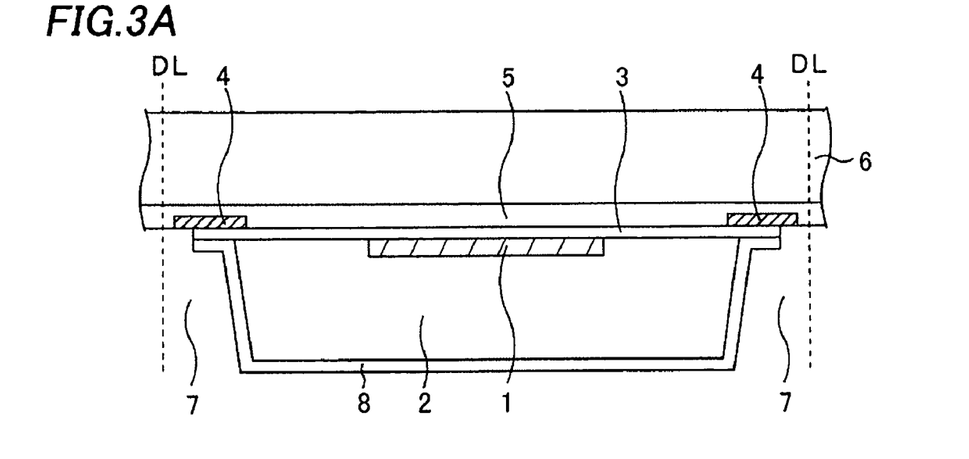
FIGS. 3A, 3B, and 3C are cross-sectional views for explaining the semiconductor device and its manufacturing method of the first embodiment of the invention.

Then, as shown in FIG. 3A, the first insulation film 3 and the second insulation film 8 are selectively etched using a photoresist layer (not shown) as a mask. By this etching, the first insulation film 3 and the second insulation film 8 formed in a region from on a portion of the pad electrode 4 to a dicing line DL are removed to expose the portion of the pad electrode 4 at a bottom of the opening 7.

Figure 3B:
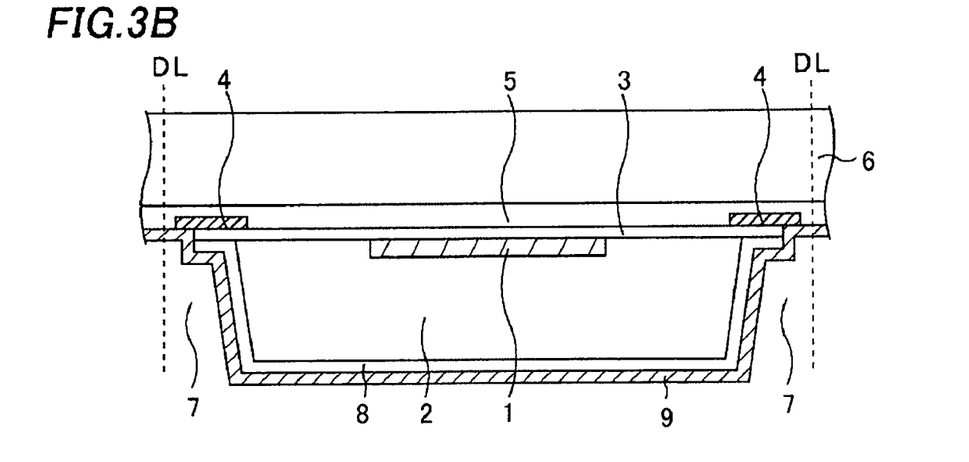

Next, as shown in FIG. 3B, a metal layer made of aluminum (Al), copper (Cu) or the like that is to be the wiring layer 9 is formed by a sputtering method, a plating method, or the other deposition method. Then, this is etched using a photoresist layer (not shown) as a mask to form the wiring layer 9 having a thickness of, for example, 1 μm on the portion of the pad electrode 4 and the second insulation film 8.

Figure 3C:
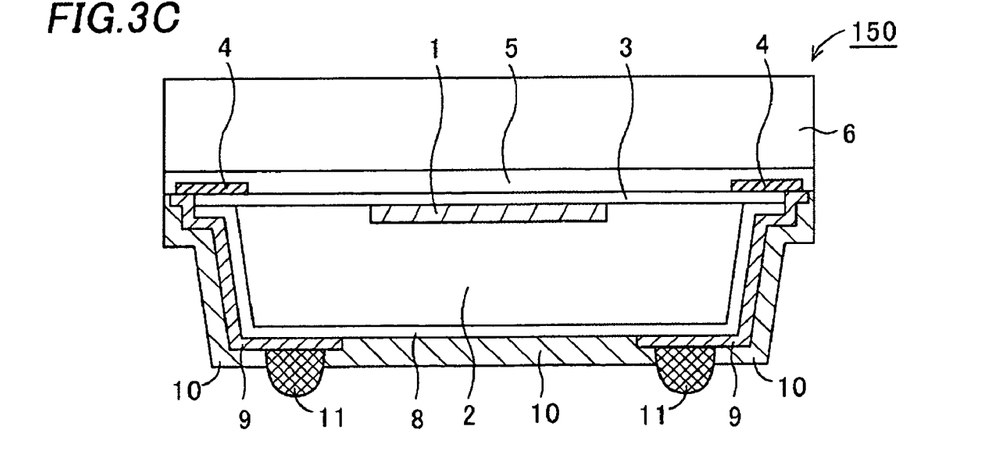

Next, as shown in FIG. 3C, the protection layer 10 made of a resist material such as a solder resist is formed on the back surface of the semiconductor substrate 2 including on the wiring layer 9. Then, as shown in FIG. 3C, an opening is formed in a predetermined region of the protection layer 10, an electrode connection layer (not shown) made of nickel, gold or the like is formed on the wiring layer 9 exposed in the opening, and the ball-shaped conductive terminal 11 made of solder, aluminum, gold or the like is formed thereon. When the protection layer 10 is made of a negative resist material, the protection layer 10 in a region irradiated with light is left as it is, and the protection layer 10 in a region irradiated with no light is removed to form the opening.

Wiring from the pad electrode 4 on the front surface of the semiconductor substrate 2 to the conductive terminal 11 formed on the back surface along the sidewall is thus realized in this manner.

It is noted that the dummy electrode 50 may be also formed in the process of forming the conductive terminal 11 according to needs as described above. In detail, an opening is formed in a predetermined region of the protection layer 10 where the dummy electrode 50 is to be formed, and the ball-shaped dummy electrode 50 made of solder, aluminum, gold, nickel or the like is formed in the opening.

Then, dicing is performed along the dicing line DL that is a boundary of a number of semiconductor devices into individual separated semiconductor devices 150.

By the above described process, the chip size package type semiconductor device having the light receiving element 1 is completed.

In the first embodiment of the invention, since the wiring layer 9 and the conductive terminal 11 are not disposed in the region overlapping the light receiving element 1 on the back surface of the semiconductor substrate 2, the conventional problem of reflection of the patterns of the wiring layer 9 and the conductive terminal 11 on an output image is prevented. Furthermore, since this effect is obtained by this changing of the positions of the wiring layer 9 and the conductive terminal 11, the number of manufacturing processes does not increase, compared with that of the conventional manufacturing processes. Furthermore, the influence of diffuse reflection is prevented by mixing the infrared ray absorbent material in the protection layer 10 or additionally providing the infrared ray absorbent layer.

Figure 4A:
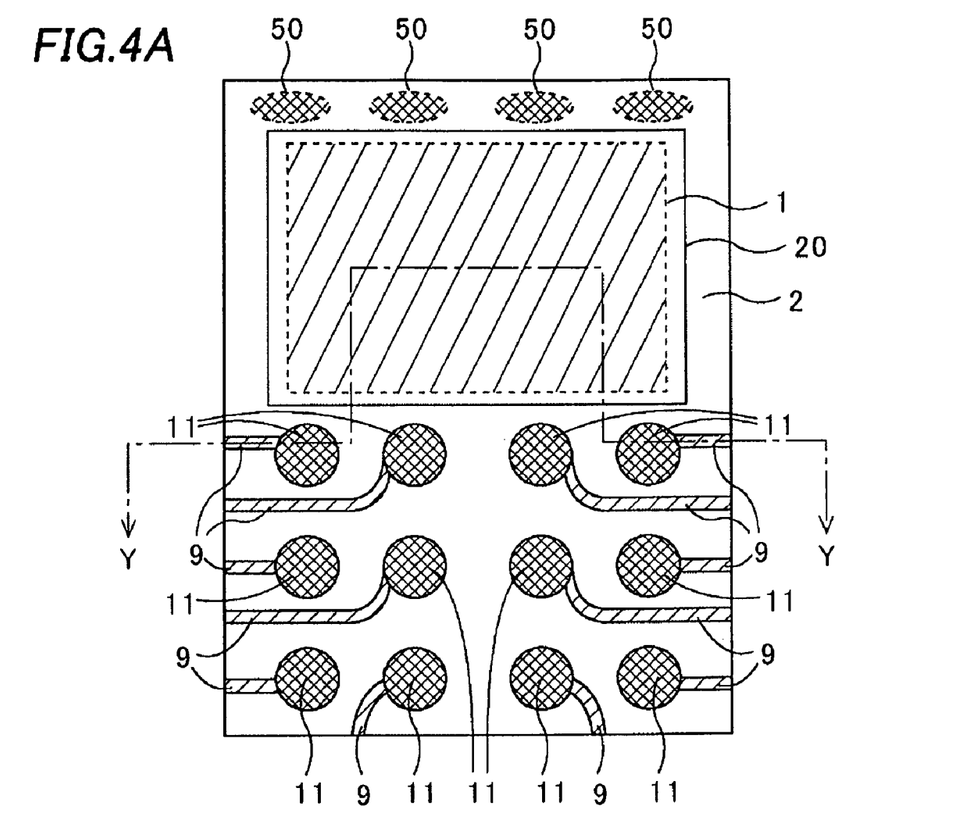
FIGS. 4A and 4B are a plan view and a cross-sectional view for explaining a semiconductor device and its manufacturing method of a second embodiment of the invention.
Figure 4B:
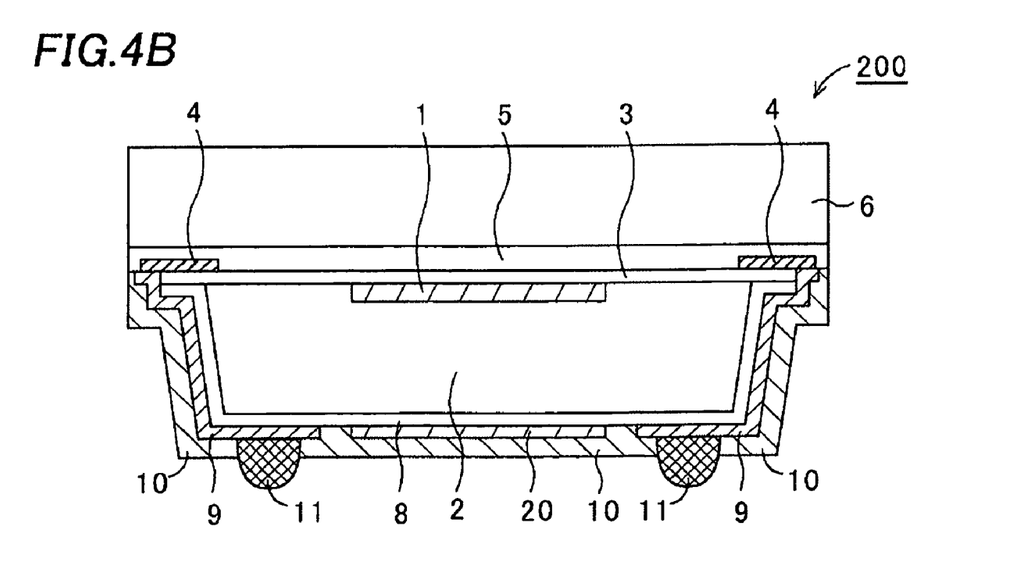

Next, a second embodiment of the invention will be described referring to FIGS. 4A and 4B. FIG. 4A is a plan view of a back surface of a semiconductor device 200 of the second embodiment of the invention, and FIG. 4B is a cross-sectional view of FIG. 4A along line Y-Y. It is noted that the same numerals are given to the same components as those of the first embodiment and the description thereof will be omitted. The second embodiment is the same as the first embodiment in that some components such as the protection layer 10 are omitted in FIG. 4A for convenience, and in that the wiring layer 9 and the conductive terminal 11 are not disposed in the region overlapping the light receiving element 1 on the back surface of the semiconductor substrate 2.

The semiconductor device 200 of the second embodiment has a feature that a reflection layer 20 made of a metal material, for example, aluminum, gold, silver, copper or the like is formed uniformly planar on the back surface of the semiconductor substrate 2 at least in the region overlapping the light receiving element 1, as shown in FIGS. 4A and 4B. The reflection layer 20 is a layer having a function of reflecting an infrared ray entering from the light transparent substrate 6 toward the back surface of the semiconductor substrate 2 through the semiconductor substrate 2 or an infrared ray from the back surface of the semiconductor substrate 2 without further transmitting it therethrough, and its material or thickness is not particularly limited as long as it has such a function. The reflection layer 20 is 0.1 to 2 μm in thickness, for example.

Furthermore, this reflection layer 20 may be made of the same material as that of the wiring layer 9 and formed in the process of forming the wiring layer 9. In detail, for example, a metal layer made of aluminum, copper or the like is formed by a sputtering method, a plating method, or the other deposition method such as shown in FIG. 3B. Then, patterning is performed to this metal layer to form the reflection layer 20 at the same time when the patterning is performed to the metal layer to form the wiring layer 9.

With the semiconductor device 200 of the second embodiment, an infrared ray entering from the light transparent substrate 6 and reaching the reflection layer 20 is reflected by this reflection layer 20 toward the light receiving element 1. In addition to the prevention of the conventional problem of reflection of the wiring layer 9 and the conductive terminal 11 on an output image, this provides an advantage that light strength of an infrared ray entering the light receiving element 1 increases to enhance the contrast of the output image. Furthermore, as described above, since the reflection layer 20 is formed in the process of forming the wiring layer 9, the number of the manufacturing processes does not increase, compared with the first embodiment.

Although the description of the above embodiments is given for the semiconductor device where the wiring layer 9 is formed extending from the pad electrode 4 formed on the front surface of the semiconductor substrate 2 onto the back surface of the semiconductor substrate 2 along the side surface thereof, this embodiment is applicable to semiconductor devices as long as those have the wiring layer and the conductive terminal formed on the back surface of the semiconductor substrate 2.

Figure 5A:
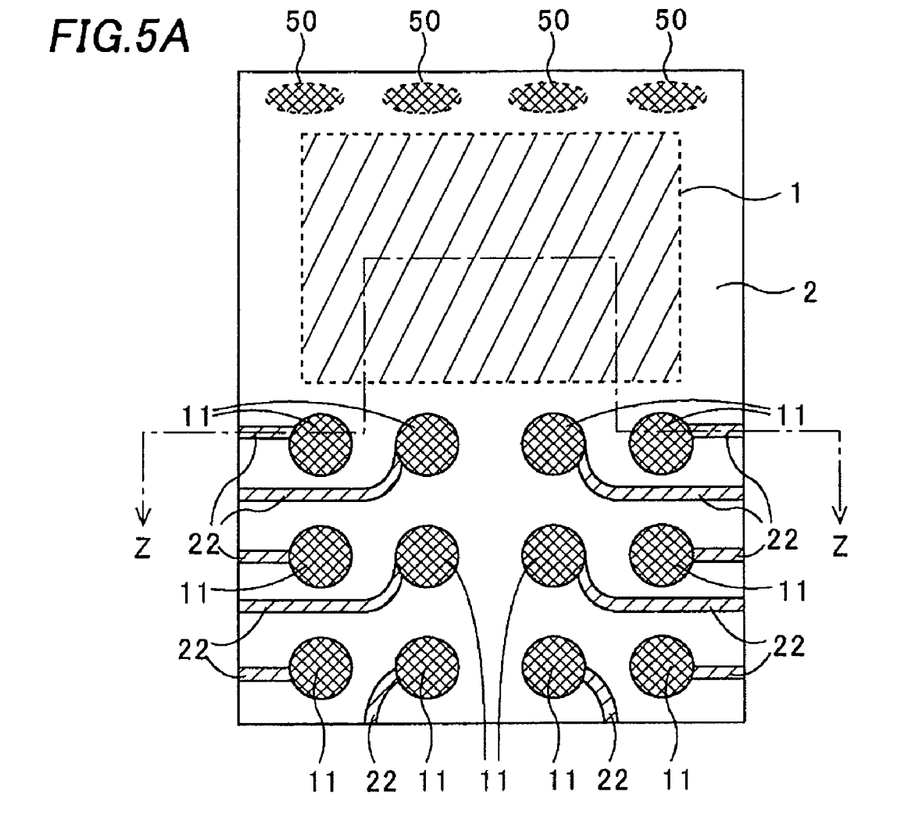
FIGS. 5A and 5B are a plan view and a cross-sectional view for explaining the semiconductor device and its manufacturing method of the invention.
Figure 5B:
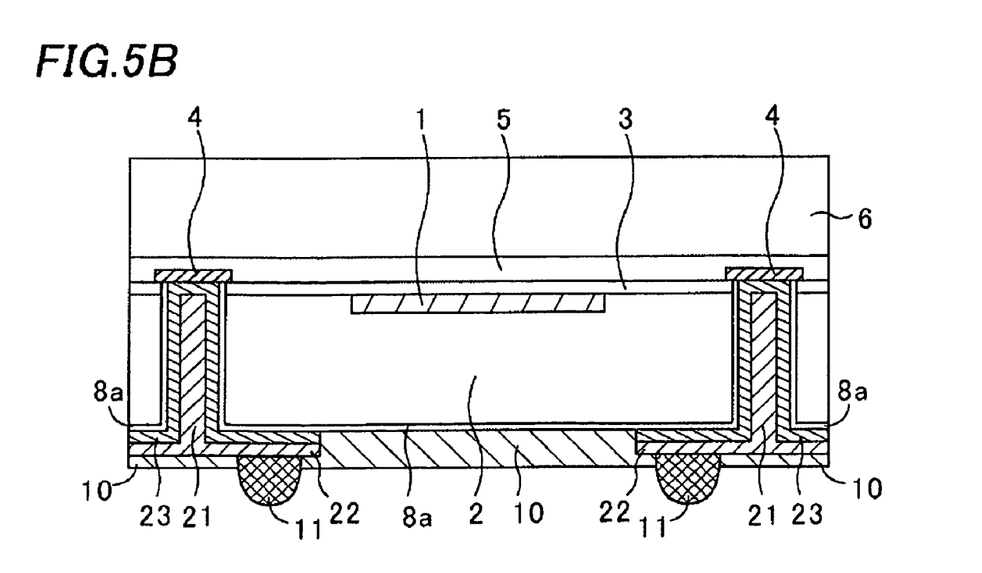

Therefore, as shown in FIGS. 5A and 5B, for example, the invention may be also applied to a so-called penetrating electrode type semiconductor device where a via hole is formed penetrating the semiconductor substrate 2 from its front surface to its back surface in a position corresponding to the pad electrode 4, a penetrating electrode 21 is formed in the via hole, and a wiring layer 22 is formed on the back surface of the semiconductor substrate 2, being electrically connected to the penetrating electrode 21. It is noted that FIG. 5B is a cross-sectional view of FIG. 5A along line Z-Z, where the same numerals are given to the same components as those of the above described semiconductor device and the description thereof will be omitted. A numeral 23 in FIG. 5B designates a barrier metal layer made of metal such as, for example, a titanium (Ti) layer, a titanium oxide (TiO$_2$) layer, a titanium nitride (TiN) layer, or a tantalum nitride (TaN) layer.

This penetrating electrode type semiconductor device is formed by the following manufacturing processes, for example. First, the semiconductor substrate 2 formed with the pad electrode 4 with the light receiving element 1 and the first insulation film 3 interposed therebetween is formed. Then, the via hole is formed, penetrating the semiconductor substrate 2 in a position corresponding to the pad electrode 4. A second insulation film 8a is then formed, covering a sidewall of the via hole and the back surface of the semiconductor substrate 2. The second insulation film 8a on a bottom of the via hole is then removed, and the barrier metal layer 23 is formed in the via hole. The penetrating electrode 21 made of metal such as copper is then formed in the via hole by, for example, an electrolytic plating method. The wiring layer 22 is formed on the back surface of the semiconductor substrate 2 except in a region overlapping the light receiving element 1 by patterning, being electrically connected to the penetrating electrode 21. The ball-shaped conductive terminal 11 and the protection layer 10 are then formed. It is noted that the above described processes are an example of the method of manufacturing the penetrating electrode type semiconductor device, and the invention is not limited to this processes. Although not shown, in the similar manner to the semiconductor device of the second embodiment, the reflection layer may be formed at least in the region overlapping the light receiving element 1 in the penetrating electrode type semiconductor device shown in FIGS. 5A and 5B.

Although the description of the above embodiments is given for the BGA type semiconductor device having the ball-shaped conductive terminal, the invention may be applied to the LGA (land grid array) type semiconductor device.

The embodiments above achieve prevention of reflection of the patterns of the conductive terminal and the wiring layer formed on the back surface of the semiconductor substrate on an output image without making the manufacturing process complex.

What is claimed is:

1. A semiconductor device comprising:
    a semiconductor substrate comprising a front surface and a back surface;
    a light receiving element formed on the front surface of the semiconductor substrate;
    a transparent substrate attached to the front surface of the semiconductor substrate so as to cover the light receiving element;
    a plurality of wiring layers formed on the back surface of the semiconductor substrate so that no one wiring layer is in a path of light passing through the transparent substrate and the light receiving element;
    a protection layer covering the wiring layers; and
    a reflection layer made of a metal and formed on the back surface of the semiconductor substrate so as to be in the path of the light passing through the transparent substrate and the light receiving element.

2. The semiconductor device of claim 1, wherein the protection layer comprises an infrared ray absorbent material.

3. The semiconductor device of claim 1, wherein the reflection layer and the wiring layers comprise the same metal.

4. The semiconductor device of claim 1, further comprising a pad electrode connected with the light receiving element, wherein one of the wiring layers extends from the back surface along a side surface of the semiconductor substrate so as to be in contact with the pad electrode.

5. The semiconductor device of claim 1, further comprising a pad electrode formed on the front surface of the semiconductor substrate, wherein the semiconductor substrate has a via hole penetrating the semiconductor substrate from the back surface to reach the pad electrode and one of the wiring layers is connected with the pad electrode through the via hole.

6. The semiconductor device of claim 5, further comprising a conductive terminal disposed on one of the wiring layers through an opening formed in the protection layer so that the conductive terminal does not overlap the via hole in plan view of the semiconductor device.

7. The semiconductor device of claim 1, further comprising a dummy electrode not connected to the light receiving element and formed on the back surface of the semiconductor substrate.

8. A semiconductor device comprising:
    a semiconductor substrate comprising a first region and a second region, the first region comprising a first front surface and a first back surface, and the second region comprising a second front surface and a second back surface;
    a light receiving element formed on the first front surface;
    a plurality of wiring layers formed on the second back surface and connected with the light receiving element;
    a transparent substrate attached to the first and second front surfaces; and
    a protection layer covering the wiring layers,
    wherein no wiring connected with the light receiving element is formed on the first back surface, and all wiring layers connected with the light receiving element are disposed on one side of the light receiving element in plan view of the semiconductor device.

9. The semiconductor device of claim 8, further comprising a reflection layer formed on the first back surface.

10. The semiconductor device of claim 8, further comprising a dummy electrode not connected to the light receiving element and formed on the first back surface of the semiconductor substrate on another side of the light receiving element opposite from said one side in the plan view of the semiconductor device.

* * * * *